United States Patent [19]

Yoshida et al.

[11] Patent Number: 5,248,662
[45] Date of Patent: Sep. 28, 1993

[54] LASER ABLATION METHOD OF PREPARING OXIDE SUPERCONDUCTING FILMS ON ELONGATED SUBSTRATES

[75] Inventors: Noriyuki Yoshida; Satoshi Takano, both of Osaka; Tsukushi Hara, Chofu; Kiyoshi Okaniwa, Chofu; Takahiko Yamamoto, Chofu, all of Japan

[73] Assignees: Sumitomo Electric Industries, Osaka; Tokyo Electric Power Company, Tokyo, both of Japan

[21] Appl. No.: 829,847

[22] Filed: Jan. 31, 1992

[30] Foreign Application Priority Data

Jan. 31, 1991 [JP] Japan ................. 3-011126

[51] Int. Cl.⁵ ............... B05D 3/06; B05D 5/12
[52] U.S. Cl. ........................ 505/1; 505/730; 505/732; 505/704; 427/62; 427/596; 427/117
[58] Field of Search ............ 505/1, 732, 730, 704; 427/53.1, 54.1, 62, 63, 117, 596

[56] References Cited

FOREIGN PATENT DOCUMENTS 0310033 4/1989 European Pat. Off.
0398374 11/1990 European Pat. Off.
2-61826 3/1990 Japan.

OTHER PUBLICATIONS

R. E. Russo et al., "Metal Buffer layers and Y–Ba–Cu–O thin films on Pt and stainless steel using pulsed laser deposition," Journal of Applied Physics, vol. 68, No. 3, 1 Aug. 1990, New York US pp. 1354–1356.

E. Narumi et al., "Superconducting $YBA_2Cu_3O_{6.8}$ films on metallic substrates using in situ laser deposition," Applied Physics Letters vol. 56, No. 26, 25 Jun. 1990, New York US pp. 2684–2686.

Hoshino et al, "Preparation of Superconducting $B_i$-$S_r$-Ca-Cu-O Printed Thick Films on MgO Substrate and Ag Metal Tape", Jpn. J. Appl. Phys. 27(7) Jul. 1988 pp. L1297–L1299.

*Primary Examiner*—Roy King
*Attorney, Agent, or Firm*—Pennie & Edmonds

[57] ABSTRACT

In order to prepare an elongated oxide superconducting material which exhibits a high critical current density, a tape-type substrate (7) of silver, for example, formed by unidirectional solidification is prepared and an excimer laser beam (9) is applied to target (8) of an oxide superconductor to deposit atoms and/or molecules being scattered from the target (8) on the substrate (7), thereby forming an oxide superconducting film on the substrate (7).

6 Claims, 2 Drawing Sheets

LASER ABLATION METHOD OF PREPARING OXIDE SUPERCONDUCTING FILMS ON ELONGATED SUBSTRATES

BACKGROUND OF THE INVENTION

1. Field of the Invention

The present invention relates to a method of preparing an oxide superconducting material, and more particularly, it relates to a method of preparing an oxide superconducting material which is provided as a film formed on a substrate.

2. Description of the Background Art

In recent years, oxide superconducting materials having high critical temperatures have been successively found and extensive study has been made in order to put such materials into practice for wires and the like. In particular, various methods have been studied for working such oxide superconducting materials into wires.

An oxide superconducting wire is typically prepared by a silver sheath method of filling a silver pipe with raw material powder and properly carrying out wire drawing, rolling and heat treatment steps for obtaining a tape-type wire. This method is effectively applied to preparation of a wire, since the material can be easily elongated and a relatively high critical current density can be attained by mechanical orientation in rolling.

However, the wire obtained by the silver sheath method merely exhibits a critical current density of a little less than 50,000 A/$cm^2$ under a zero external magnetic field and that of about 10,000 A/$cm^2$ at the maximum under a magnetic field of 1 T (tesla), which are insufficient for wide application to a cable or a magnet.

Although a solution coating method is also studied for preparation of a wire, this method is extremely inferior to the silver sheath method in view of the critical current density.

In relation to study of a thin film, on the other hand, a thin film having a critical current density of at least 4 million A/$cm^2$ has been obtained. However, a thin film of such a high property can be formed only on a single crystal of an oxide such as strontium titanate. It is technically difficult to prepare a large oxide single crystal, and such a material cannot be bent for lack of flexibility. Therefore, it is impossible to prepare a long material which can provide a wire, so far as an oxide single crystal is employed as a substrate.

SUMMARY OF THE INVENTION

Accordingly, an object of the present invention is to provide a method of preparing an oxide superconducting material which can be easily elongated, with a critical current density being applicable in a wide range.

The method of preparing an oxide superconducting material according to the present invention is first characterized in employment of a substrate of a metal or alloy which is prepared by unidirectional solidification. The present invention is also characterized in that an oxide superconducting film is formed on such a substrate by a laser ablation method of applying a laser beam onto a target of an oxide superconductor and depositing atoms and/or molecules being scattered from the target on the substrate.

Throughout the specification, the term "unidirectional solidification" indicates a method of unidirectionally providing a solid-liquid interface with a large temperature gradient in a process of solidifying a molten metal or alloy for preventing arbitrary formation of crystal nuclei in the liquid phase and facilitating crystal growth only in the solid-liquid interface, thereby supplying a unidirectional property to the structure.

The inventors have found that an oxide superconducting film which is formed on a commercially available silver single crystal substrate by laser ablation with an excimer laser attains a critical current density of about 2 million A/$cm^2$. However, an ordinary silver single crystal, which is prepared by the Bridgeman method or the Verneuil's method of heat treating a plate for a long time, is restricted in length.

On the other hand, a unidirectionally solidified material has no clear grain boundaries with substantially uniform in-plane crystal orientation on crystal surfaces and crystal orientation in directions perpendicular to the surfaces, although the same is inferior in crystallinity to a single crystal which is prepared by the Bridgeman method or the Verneuil's method. When an oxide superconducting film was formed on such a unidirectionally solidified material by excimer laser ablation, the film exhibited no clear grain boundaries since the unidirectionally solidified material serving as a substrate had no clear grain boundaries.

The as-obtained oxide superconducting film exhibited a critical current density of 2 to 3 million A/$cm^2$, which was equivalent to or higher than that of a film formed on the aforementioned commercially available silver single crystal substrate. It is estimated that the unidirectionally solidified material employed in the present invention had a high dislocation density due to a high growth rate, whereby the dislocation density of the oxide superconducting film was increased as compared with the film formed on the aforementioned commercially available silver single crystal substrate leading to increase of pinning points, thereby implementing a high critical current density.

Throughout the specification, each numerical value of "critical current density" represents a transportation current density which has been measured by an ordinary four-probe method under a zero external magnetic field at a temperature of 77 K (cooling temperature with liquid nitrogen), unless otherwise stated.

Thus, according to the present invention, a substrate is formed by a unidirectionally solidified material which can be easily elongated, and an oxide superconducting film is formed on such a substrate by a laser ablation method through which a high film forming rate is attained and the composition can be easily controlled. Thus, it is possible to efficiently prepare a long oxide superconducting material having a high critical current density. In particular, the critical current density of the inventive material is substantially equivalent to that of a conventional oxide superconducting thin film which is formed on a silver single crystal, and the inventive material exhibits properties which are equivalent to or higher than those of an oxide superconducting film which is formed on a commercially available silver single crystal. Further, a substrate prepared by unidirectional solidification, which is formed of a metal or alloy, can be easily provided with proper flexibility.

Therefore, the present invention can be advantageously applied to preparation of a superconducting wire which is employed for a cable or a magnet. Further, the present invention is also advantageously applicable to preparation of a large-sized material such as one used in an acceleration cavity.

As to an oxide superconducting material which is watched with interest as a superconducting material requiring no employment of scarce liquid helium, it has been difficult to improve the critical current density due to a short coherence length. This problem can also be solved by the present invention, which is extremely useful for putting an oxide superconducting material into practice as an industrial material.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 2:
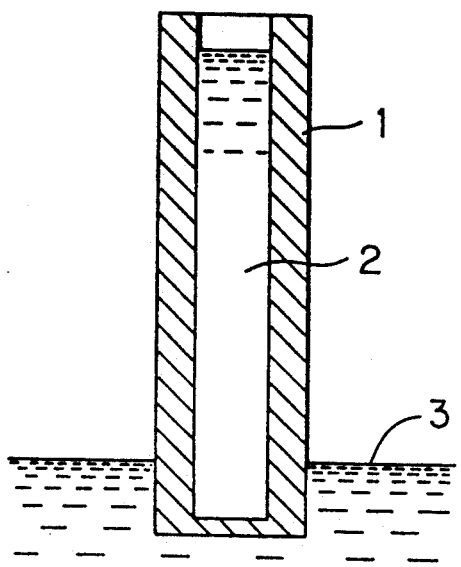
FIG. 2 is a principle diagram showing an apparatus for preparing a substrate by unidirectional solidification.

According to the present invention, a substrate of a metal or alloy is prepared by unidirectional solidification. The material for such a substrate is prepared from silver, for example. In order to attain such unidirectional solidification, molten silver 2 is introduced into a heated pipe-shaped graphite crucible 1, whose lower end is brought into contact with water 3 as shown in FIG. 2, for example. Silver can be unidirectionally solidified by another method such as that for discharging molten silver from a nozzle, watering the discharged part for solidifying the same and continuously drawing out the solidified part in the form of a plate, for example. This method is particularly suitable for preparing a long substrate. According to the result of study which was made by the inventors, the critical current density of an oxide superconducting film has a tendency to rise as the temperature gradient of a solidification interface is increased.

While the highest critical current density of an oxide superconducting film is obtained when a unidirectionally solidified substrate is employed, the inventors have also found that a high critical current density is effectively obtained also when the substrate is prepared by rolling or drawing a unidirectionally solidified plate. In order to increase the critical current density of the overall superconducting material including the substrate, for example, the substrate preferably has a smaller sectional area. In view of this point, it is useful to further roll or draw a plate which is obtained by unidirectional solidification for preparing a substrate having a small sectional area.

According to the present invention, a laser ablation method is applied in order to form an oxide superconducting film on a substrate which is obtained in the aforementioned manner. Such a laser ablation method is preferably carried out with an excimer laser of KrF (248 nm in wavelength), ArF (193 nm in wavelength) or XeCl (308 nm in wavelength).

The present invention is applied to an oxide superconducting material of Y-Ba-Cu-0, Bi-Sr-Ca-Cu-0, Tl-Ba-Ca-Cu-O or the like. The effect of the present invention can be expected in any case.

Experimental Examples of the present invention are now described.

Experimental Example 1

In an experiment of preparing a silver substrate, it has been proved that a large single-crystalline material can be easily obtained by simply unidirectionally cooling silver. No clear grain boundaries were observed in a silver material which was prepared in such a manner, although its dislocation density was larger by at least a figure than a commercially available silver single crystal.

Figure 3:
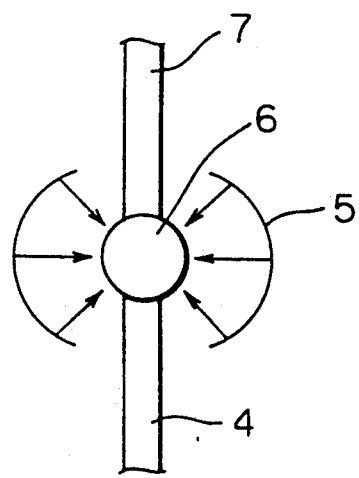
FIG. 3 is a principle diagram showing another apparatus for preparing a substrate by unidirectional solidification.

A silver substrate was prepared by a floating zone melting method shown in FIG. 3. A silver tape 4 of 1.5 mm in thickness and 10 mm in width was pulled up at a rate of 50 mm/min. while light was applied to both surfaces of the silver tape 4 from an infrared ray lamp 5 of 100 W and converged in a range of 1 mm in length, to form a fusion zone 6. The silver tape 4 was held by the surface tension of the fusion zone 6, and a tape-type silver substrate 7 of 60 cm in length was continuously obtained in this state.

Crystal orientation of this silver substrate 7 was examined through X-ray diffraction over the longitudinal direction. As the result, it was recognized that the surface was formed by (100) planes substantially along the overall length, and [011] directions were longitudinally uniform along the tape-type silver substrate 7.

Figure 1:
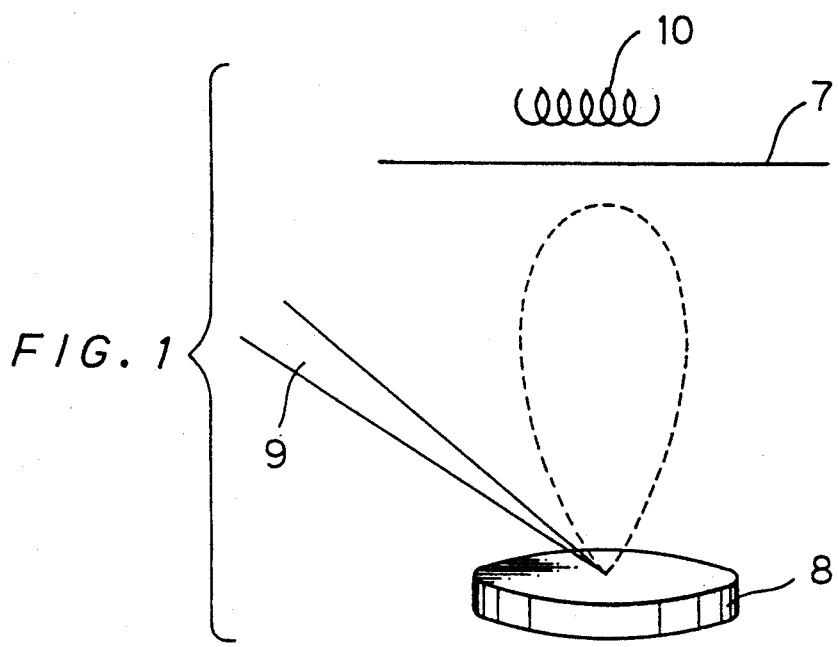
FIG. 1 is an explanatory diagram showing a laser ablation step which is included in an embodiment of the present invention.

Then, the silver substrate 7 was arranged in a film forming apparatus employing excimer laser ablation as shown in FIG. 1. In this film forming apparatus, a target 8 of a Y-Ba-Cu-0 sintered body was arranged to be opposite to the silver substrate 7. An excimer laser beam 9 of KrF (248 nm in wavelength) was applied to this target 8. The silver substrate 7 was carried along its longitudinal direction, and heated by a heater 10 in a back side of the region which was opposite to the target 8.

Thus, a Y-Ba-Cu-0 oxide superconducting film was formed on the silver substrate 7 by the film forming apparatus shown in FIG. 1. The as-formed oxide superconducting film was 1.8 $\mu$m in average thickness with dispersion of $\pm 4\%$. This superconducting tape exhibited a critical current density of 2,400,000 A/cm$^2$ along the overall length of 60 cm, while a critical current value of 430 A was recorded.

Experimental Example 2

A tape-type silver substrate, which was similar to that of Experimental Example 1, was employed and a Bi-Sr-Ca-Cu-O oxide superconducting film was formed thereon by the excimer laser ablation method shown in FIG. 1. The as-formed superconducting tape was heat treated in the atmosphere at 880° C. for 1 hour, to attain a critical current density of 420,000 A/cm$^2$ along the overall length of 60 cm. The as-obtained oxide superconducting film was 1.6 $\mu$m in thickness and exhibited a critical current value of 67 A.

Experimental Example 3

Silver tapes obtained by the crucible method shown in FIG. 2 were employed as substrates. These silver tapes were 30 cm in length, 10 mm in width and 1.5 mm in thickness.

A Bi-Sr-Ca-Cu-0 oxide superconducting film and a Y-Ba-Cu-O oxide superconducting film were formed on these silver tapes in a similar manner to Experimental Examples 1 and 2 respectively. These oxide superconducting films were 1.7 μm and 1.3 μm in thickness respectively, and exhibited critical current densities $J_c$ and critical current values $I_c$ shown in Table 1.

TABLE 1

|  | $J_C$ | $I_C$ |
|---|---|---|
| BiSrCaCuO | 870,000 A/cm$^2$ | 147 A |
| YBaCuO | 3,120,000 A/cm$^2$ | 450 A |

Experimental Example 4

The same silver tapes as that in Experimental Example 3 were rolled into 0.2 mm in thickness, to prepare thin tape-type substrates. Then, a Bi-Sr-Ca-Cu-0 oxide superconducting film and a Y-Ba-Cu-0 oxide superconducting film were formed on the tape-type substrates in a similar manner to Experimental Examples 1 and 2. The as-formed superconducting tapes were 150 cm in length. These superconducting films were 1.9 μm and 2.2 μm in thickness respectively, and exhibited critical current densities $J_c$ and critical current values $I_c$ shown in Table 2.

TABLE 2

|  | $J_C$ | $I_C$ |
|---|---|---|
| BiSrCaCuO | 170,000 A/cm$^2$ | 32 A |
| YBaCuO | 690,000 A/cm$^2$ | 152 A |

Although the properties attained in Experimental Example 4 were inferior to those in Experimental Examples 1 to 3 employing unidirectionally solidified substrates with no rolling, it is understood that the properties were extremely improved as compared with superconducting properties of various oxide superconducting materials such as a conventional superconducting wire prepared by a silver sheath method.

Although the present invention has been described and illustrated in detail, it is clearly understood that the same is by way of illustration and example only and is not to be taken by way of limitation, the scope of the present invention being limited only by the terms of the appended claims.

What is claimed is:

1. A method of preparing an oxide superconducting film having an improved critical current density of at least $10^6$ A/cm$^2$ under a zero external magnetic filed, said method comprising the steps of:
   preparing an elongated substrate of a noble metal or a noble metal alloy, said substrate formed by unidirectional solidification; and
   applying a laser beam to a target of an oxide superconductor and depositing atoms and/or molecules being scattered from said target on said substrate, thereby forming said oxide superconducting film on said substrate.

2. A method of preparing an oxide superconducting film in accordance with claim 1, wherein said laser beam is an excimer laser beam.

3. A method of preparing an oxide superconducting film in accordance with claim 2, wherein said excimer laser beam is selected from the group consisting of KrF with a wavelength of 248 nm, ArF with a wavelength of 193 nm, and XeCl with a wavelength of 308 nm.

4. A method of preparing an oxide superconducting film in accordance with claim 1, wherein said substrate is made of silver.

5. A method of preparing an oxide superconducting film in accordance with claim 1, further comprising a step of rolling said substrate prior to performing said step of applying said laser beam.

6. A method of preparing an oxide superconducting film in accordance with claim 1, further comprising a step of drawing said substrate prior to performing said step of applying said laser beam.

* * * * *